July 18, 1961 — P. B. CURTIS — 2,992,539

THERMOELECTRIC DEVICES

Filed Oct. 27, 1959

INVENTOR
PETER BRYAN CURTIS
BY Kirschstein, Kirschstein & Ottinger
ATTORNEYS

United States Patent Office 2,992,539

Patented July 18, 1961

2,992,539
THERMOELECTRIC DEVICES

Peter Bryan Curtis, Harrow Weald, England, assignor to The General Electric Company Limited, London, England Filed Oct. 27, 1959, Ser. No. 848,971
Claims priority, application Great Britain Oct. 29, 1958
5 Claims. (Cl. 62—3)

This invention relates to thermoelectric devices, and is concerned particularly with thermoelectric devices of the kind comprising an assembly of thermocouples in which the dissimilar elements of the thermocouples are of semiconductor material such as bismuth telluride. Devices of this kind may be incorporated in cooling units for thermoelectric refrigerators, and in U.S. Letters Patent No. 2,932,953 dated April 19, 1960, there are described several such cooling units each comprising an assembly of thermocouples each having a p-type semiconductor element in association with an n-type semiconductor element, the elements being electrically connected to provide hot and cold thermojunctions on opposite sides of the assembly respectively, and heat exchange members associated with the said thermojunctions.

In order that such a cooling unit should operate efficiently it is important that the impedance to heat transfer between the theremojunctions and their associated heat exchange members should be kept as low as possible, and one object of the present invention is to provide an improved construction of cooling unit in which the heat exchange members and the thermojunctions are adapted so as to assist this heat transfer.

According to the present invention, in a thermoelectric device comprising an assembly of thermocouples each having a p-type semiconductor element in association with an n-type semiconductor element, the elements being electrically connected to provide hot and cold thermojunctions on opposite sides of the assembly respectively, and heat exchange members associated with said thermojunctions, the electrical connections providing the thermojunctions are formed by metal connectors, and the heat exchange members, or a part thereof, are castings of low melting point metal cast onto the connectors so that the connectors are embedded in the castings, said members each being electrically, but not thermally, insulated from the thermojunctions by a film of insulating material.

By low melting point metal is meant a metal whose melting point is low enough to enable it to be cast onto the connectors without impairing the electrical properties of the device by overheating; thus, the castings may be of Wood's metal. Preferably, the semiconductor elements are of bismuth telluride.

Figure 1:
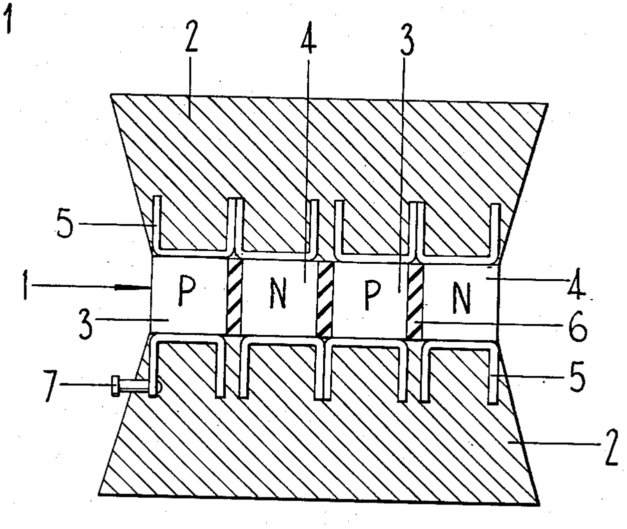
Figure 2:
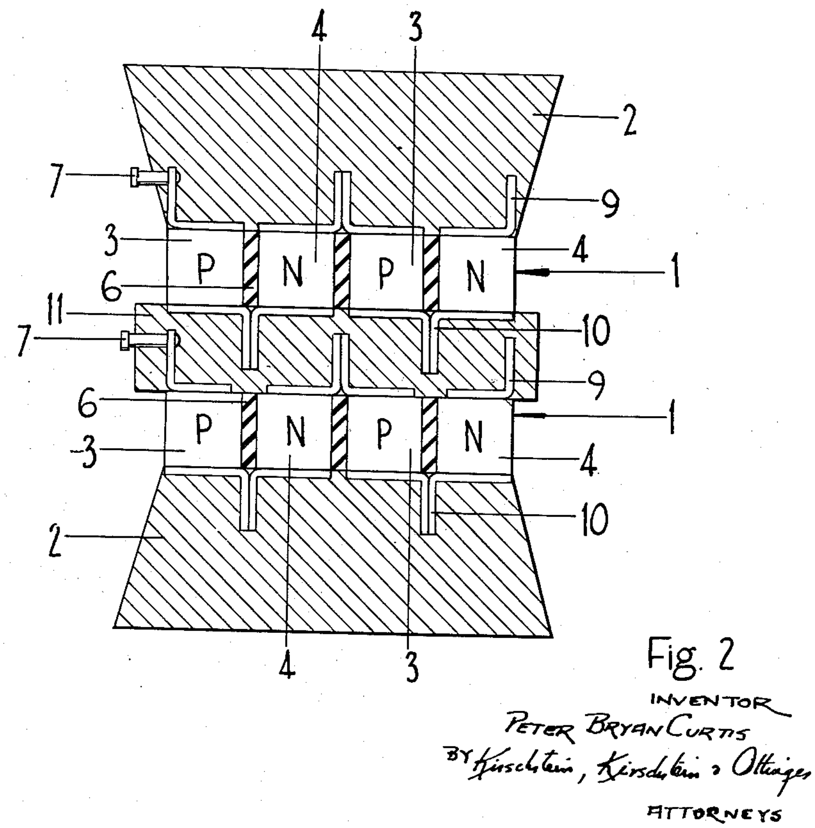

In order that the invention may be clearly understood, two thermoelectric devices in accordance with the invention will now be described, by way of example, with reference to the accompanying diagrammatic drawing in which FIGURES 1 and 2 are sectional elevations of the two devices.

Referring to FIGURE 1, the first thermoelectric device comprises essentially an assembly of thermocouples 1 and heat exchange members 2 disposed one on either side of the assembly. The dissimilar elements of the thermocouple assembly are constituted by p-type and n-type bismuth telluride elements 3 and 4 arranged alternately in a plurality of parallel rows to form a generally rectangular assembly. The elements are connected electrically in series by means of U-shaped metal connectors 5 so as to provide hot junctions on one side of the assembly and a corresponding number of cold junctions on the other side of the assembly. Each element is provided on two opposite faces with two terminals 5, these terminals being of iron or other ferrous metal, and the appropriate adjacent pairs of limbs of the terminals on each two adjacent bismuth telluride elements are soldered together to connect the elements in series. End terminals 7 are provided for external connections. The spaces between the elements of the assembly are filled with a resin filler 6. The two sides of the assembly, including the surfaces of the metal connectors and the terminals 7 are coated with a film of "Araldite" which serves to insulate the assembly electrically from the heat exchange members.

Each heat exchange member is a casting of low melting point metal, such as Wood's metal, which is cast onto one side of the assembly so that the coated connectors lie embedded in the member thus providing an extended heat transfer surface between the thermojunctions and the heat exchange members.

The invention is especially applicable to the construction of cooling units in which several thermojunction assemblies are arranged, as it were, thermally in series. Thus, referring now to FIGURE 2, the second device comprises two thermocouple assemblies 1, each consisting of p-type and n-type bismuth telluride elements 3 and 4 connected to provide hot and cold thermojunctions as in the first device. The metal connectors 9, providing the hot thermojunctions, and the metal connectors 10, providing the cold thermojunctions, are in this case L-shaped strips, the upstanding limbs of which are soldered together in pairs. As in the first device, the connectors lie embedded in castings of low melting point alloy, which are cast onto them, but besides the outermost castings 2 which constitute, or form part of, heat exchange members there is an intermediate casting 11 constituting a heat exchange member between the hot surface of one assembly and the cold surface of the other assembly.

The spaces between the elements 3 and 4 are filled with resin filler 6. The connectors 9 and 10, and the terminals 7 are coated with a film of "Araldite" to insulate the assembly electrically from the heat exchange members.

Either of the above devices may be modified by making each heat exchange member 2 a composite member comprising a machined fin assembly and a casting of low melting point alloy. The alloy would be cast directly onto the coated metal connectors so that it acts as a filler to enhance the heat transfer between the fin assemblies and the thermojunctions. In many applications this modified construction is preferable since the fin assembly may be of copper or aluminum while the quantity of alloy used, which is a relatively poor conductor, can be kept to a minimum.

I claim:

1. A thermoelectric device comprising an assembly of thermocouples, each thermocouple comprising a pair of dissimilar elements and said elements being connected electrically in series to provide two sets of alternate junctions disposed respectively on opposite sides of said assembly, metal connectors constituting the electrical connections between said elements, a first heat conducting member disposed in heat conducting relation with one set of alternate junctions, and a second heat conducting member disposed in heat conducting relation with the other set of alternate junctions, each said heat conducting member being constituted by a casting of low melting point metal, and said metal connectors lying embedded in said castings and being electrically insulated therefrom.

2. A thermoelectric device comprising an assembly of thermocouples, each thermocouple comprising a p-type semiconductor element in association with an n-type semiconductor element and said elements being connected electrically in series to provide two sets of alternate junctions disposed respectively on opposite sides of said assembly, metal connectors constituting the electrical connections between said semiconductor elements, a first heat conducting member constituted by a casting of low melting point metal disposed in heat conducting relation with one set of junctions, and a second heat conducting member constituted by a casting of low melting point metal disposed in heat conducting relation with the other set of junctions, said metal connectors lying embedded in said castings and being electrically insulated therefrom.

3. A thermoelectric device as set forth in claim 2, wherein the low melting point metal is Wood's metal.

4. A thermoelectric device comprising an assembly of thermocouples, each thermocouple comprising a pair of dissimilar elements and said elements being connected electrically in series to provide two sets of alternate junctions disposed respectively on opposite sides of said assembly, terminal members bonded to said elements, each said terminal member having an upturned limb portion projecting away from its respective element and the limb portions of said terminal members being soldered together in pairs to provide the electrical connections between said elements, a first heat conducting member disposed in heat conducting relation with one set of alternate junctions, and a second heat conducting member disposed in heat conducting relation with the other set of alternate junctions, each said heat conducting member being constituted by a casting of low melting point metal, and said pairs of soldered limb portions lying embedded in said castings and being electrically insulated therefrom.

5. A thermoelectric device comprising a first thermocouple assembly, a second thermocouple assembly, each thermocouple of said assemblies comprising a pair of dissimilar elements and said elements being connected electrically in series to provide hot junctions and cold junctions disposed respectively on opposite sides of each assembly, metal connectors constituting the electrical connections between said elements, a first heat conducting member disposed in heat conducting relation with the hot junctions of said first assembly, a second heat conducting member disposed in heat conducting relation with the cold junctions of said second assembly, and a third heat conducting member disposed between said assemblies and constituting a heat conducting path between the cold junctions of said first assembly and the hot junctions of said second assembly, each said heat conducting member being constituted by a casting of low melting point metal and said metal connectors lying embedded in said castings and being electrically insulated therefrom.

References Cited in the file of this patent

UNITED STATES PATENTS

| | | |
|---|---|---|
| 2,396,338 | Newton | Mar. 13, 1946 |
| 2,844,638 | Lindenblad | July 22, 1958 |

FOREIGN PATENTS

| | | |
|---|---|---|
| 817,076 | Great Britain | July 22, 1959 |
| 817,077 | Great Britain | July 22, 1959 |
| 1,059,939 | Germany | June 25, 1959 |